United States Patent [19]

Hochreuther et al.

[11] Patent Number: 4,522,061
[45] Date of Patent: Jun. 11, 1985

[54] PORTABLE MEASURING DEVICE

[75] Inventors: Karl Hochreuther, Nuremberg, Fed. Rep. of Germany; Jörg Tragatschnig, Zell am See, Austria

[73] Assignee: Metrawatt GmbH, Nuremberg, Fed. Rep. of Germany

[21] Appl. No.: 522,055

[22] Filed: Aug. 10, 1983

[30] Foreign Application Priority Data

Aug. 10, 1982 [DE] Fed. Rep. of Germany ....... 3229689

[51] Int. Cl.³ .................. G01D 11/24; G01D 11/30
[52] U.S. Cl. ..................................... 73/431; 73/432 R
[58] Field of Search .................. 73/431, 432 R, 23; 224/205, 257; 324/156; 174/46; 179/157

[56] References Cited

U.S. PATENT DOCUMENTS 2,455,786 12/1948 Lanter ..................................... 174/46
2,842,741 7/1958 Simkins ............................... 324/156
3,433,905 3/1969 Pless ..................................... 179/157
3,608,362 9/1971 Chakar et al. ......................... 73/629

Primary Examiner—James J. Gill
Attorney, Agent, or Firm—Herbert L. Lerner; Laurence A. Greenberg

[57] ABSTRACT

Portable measuring device, including a measuring instrument, a carrying strap fastened to the measuring instrument for hanging the measuring instrument around the neck, measuring lines electrically connected to the measuring instrument and passing through at least part of the carrying strap, measuring probes connected to the measuring lines, the measuring lines being in the form of flexible spiral cables between the carrying strap and the measuring probes, and at least one mounting disposed on the measuring instrument for fastening unused measuring probes hanging on the measuring lines.

13 Claims, 5 Drawing Figures

PORTABLE MEASURING DEVICE

The invention relates to a portable measuring device, including a measuring instrument, a carrying strap fastened to the measuring instrument for hanging the measuring instrument around the neck, measuring lines electrically connected to the measuring instrument and measuring probes connected to said measuring lines.

Such measuring devices with a multi-purpose measuring instrument, masuring cables associated therewith and probes fastened to the cables, are frequently used for measuring and testing operations where no work table is available. In such applications, it is advantageous for the measuring device to have a carrying strap for suspending the device around the neck. In this way, it can be easily carried from one work station to another, without holding the instrument in the hand, so that the hands remain free for performing the measuring operation.

A foldable multi-purpose measuring device is known from German Published, Non-Prosecuted Application DE-OS No. 28 36 679, wherein the device is constructed in such a way that it can be carried with a carrying strap around the neck. However, this portable measuring device has the disadvantage that the relatively long measuring lines thereof are directly connected to the measuring instrument, and dangle from the instrument like a pendulum. The uncontrolled dangling of the measuring lines is not only extremely annoying, but it also represents a considerable source of danger, for the user as well as for the apparatus which is tested. To avoid these dangers, the measuring lines would have to be removed from the measuring instrument and carried by hand, in which case other operations would be inhibited.

It is accordingly an object of the invention to provide a portable measuring device, which overcomes the hereinafore-mentioned disadvantages of the heretofore-known devices of this general type, and to provided a device which can be hung around the neck for performing measuring and testing operations in situ, wherein the measuring probes are disposed in such a way that they are easy to reach, the length of the measuring cables is sufficiently long, and measuring probes which are not in use do not dangle in an uncontrolled manner.

With the foregoing and other objects in view there is provided, in accordance with the invention, a portable measuring device, including a measuring instrument, a carrying strap fastened to the measuring instrument for hanging the measuring instrument around the neck, measuring lines electrically connected to the measuring instrument and passing through at least part of the carrying strap, measuring probes connected to measuring lines, the measuring lines being in the form of flexible or extensible spiral cables between the carrying strap and the measuring probes, and at least one mounting disposed on the measuring instrument for fastening unused measuring probes hanging on the measuring lines.

In accordance with another feature of the invention, the carrying strap has two ends fastened to the measuring instrument, the measuring lines are electrically connected to the measuring instrument in vicinity of the ends of the carrying straps, and the measuring lines emerge from the carrying strap substantially at shoulder height and each hangs down at a respective side of the measuring instrument and lead to a respective one of the measuring probes.

Further in accordance with the objects of the invention, there is provided a portable measuring device, including a measuring instrument, a carrying strap for hanging the measuring instrument around the neck, measuring lines electrically connected to the measuring instrument, passing through at least part of the carrying strap and emerging from the carrying strap substantially at shoulder height, measuring probes each being connected to a respective one of the measuring lines and each hanging down from a respective side of the carrying strap, one of the measuring probes being combined with the measuring instrument, the measuring lines being in the form of flexible or extensible spiral cables between the carrying strap and the measuring probes, and at least one mounting disposed on the carrying strap for fastening unused measuring probes hanging on the measuring lines.

In accordance with a further feature of the invention, the carrying strap has ends connected to each other.

In accordance with an additional feature of the invention, the carrying strap has ends, and including a connecting bar connected between the ends.

In accordance with an added feature of the invention, the mounting includes at least one holding pin disposed on the carrying strap being engageable in holding openings formed in the measuring probes for securing the measuring probes.

In accordance with yet another feature of the invention there is provided restraining elements connecting the flexible spiral cables to the carrying strap where the measuring lines emerge from the carrying strap, for protecting the measuring lines against breakage.

In accordance with yet a further feature of the invention there is proved means disposed in the middle of the carrying strap for parting and reconnecting the carrying strap.

In accordance with a concomitant feature of the invention, the one measuring probe combined with the measuring instrument has a recess formed therein for receiving the other measuring probe, and the holding pin interconnects the measuring probes substantially at belt height.

An important advantage of the measuring device according to the invention is that the measuring lines do not hang down from the multi-purpose measuring instrument, but starting from the instrument, they are conducted upward through the carrying strap, and emerge and hang down above the measuring instrument. In order to provided a sufficient radius of action or movement for measuring, the measuring lines must have a correspondingly long length. Since the measuring lines between the carrying strap and the measuring strap are in the form of extensible or flexible spirally coiled cables, the lines only hand down approximately to the level of the multi-purpose measuring device, but can be stretched considerably when a measurement is taken. Uncontrolled dangling of the probes is considerably reduced by this feature alone, and by using the mounting according to the invention, it can be completely avoided.

In general, the measuring device is constructed in such a way that the measuring instrument is fastened between the two ends of the carrying strap. In vicinity of these two ends, the measuring lines which are conducted within the carrying strap are electrically connected with the measuring instrument. It is advantageous if the measuring lines emerge from the carrying strap approximately at shoulder height, because in this way they are sufficiently long, but the measuring probes hand down just enough so that they can be easily reached by the hand. The carrying strap can be parted in the middle, i.e. where no measuring lines are conducted within the carrying strap. The radius of action or movement of the measuring lines can therefore be increased by the length of the carrying strap, if the measuring device is used while laying on the table.

Modern integrated circuit components permit the development of very small measuring instruments, so that it becomes feasible to combine the measuring instrument with one of the two measuring probes. In this case, the measuring instrument is not fastened between the two ends of the carrying strap, but it is only attached at one end of the measuring line which is constructed as a spiral cable. The measuring line is again conducted through the carrying strap, although it now is continuously conducted to the other measuring probe. It is practical to insert a connecting bar in vicinity of the free ends of the carrying strap, to avoid the carrying strap from sliding off the shoulder.

It is of great importance for the operating ease of the measuring device, for the measuring probes to be easy accessible, and not dangle uncontrollably. A practical storage device for inserting the measuring probes is provided by constructing the mountings as storage pockets and by fastening them in vicinity of the ends of the carrying strap.

A quick holding device for the measuring probes is also provided by a holding pin which is fastened to the carrying strap and which engages in a holding opening in the measuring probes. In this case, the principle of a press fastener or push button is applied. Such a mounting can be used with or without the storage pocket.

The measuring line is very easily broken at the location where it emerges from the carrying strap. To avoid damage to the measuring line, a restraining element is secured to the carrying strap to avoid wire breakage.

Other features which are considered as characteristic for the invention are set forth in the appended claims.

Although the invention is illustrated and described herein as embodied in portable measuring device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
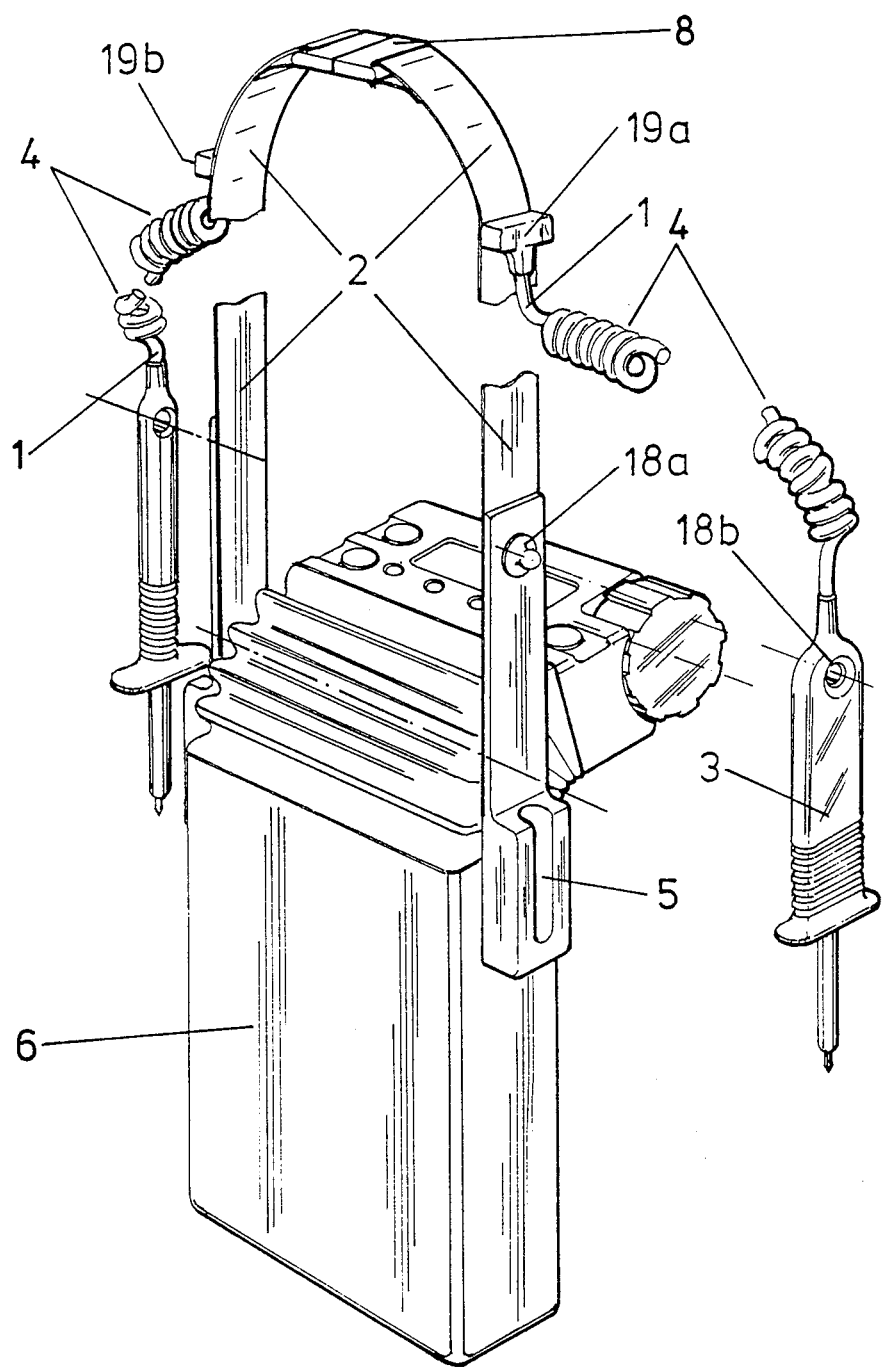
FIG. 1 is a fragmentary, diagrammatic, perspective view of a measuring device wherein the measuring instrument is hanging between the ends of a carrying strap.

Referring now to the figures of the drawing in detail and first particularly to FIG. 1 thereof, it is seen that the measuring device is formed of a measuring instrument 6, a carrying strap 2, measuring cables 1 and measuring probes 3. The carrying strap 2 is secured at both sides of the measuring device, and is provided at the ends thereof with holding means or mountings 5, 18 for holding the measuring probes 3. The holding means which are used are in the form of storage pockets 5 and/or pressure button connections 18. At the pressure button connections 18, a holding pin 18a engages in a holding opening 18b, which is provided in a gripping region of the measuring probe 3.

Figure 2:
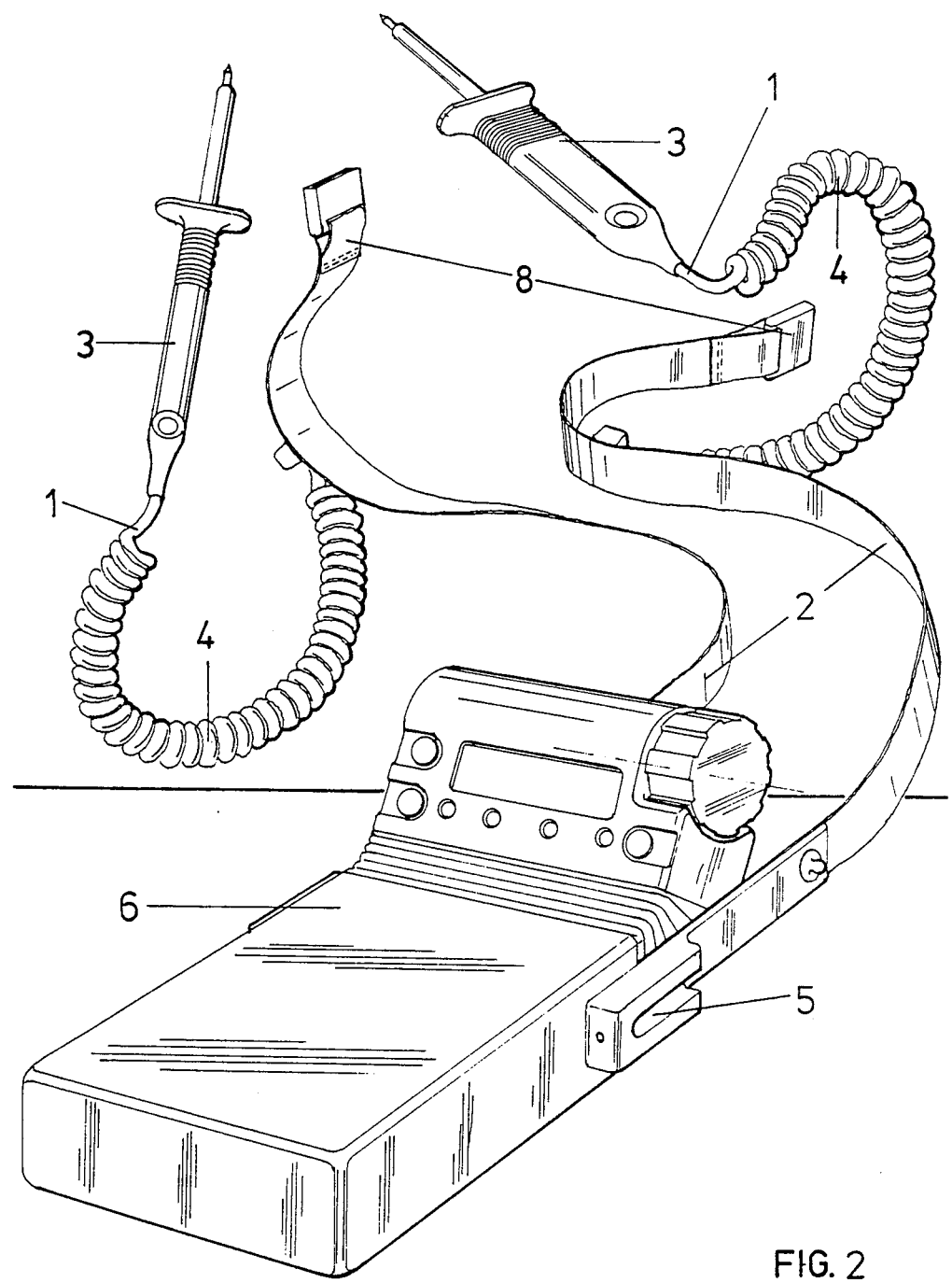
FIG. 2 is a view similar to FIG. 1 of the measuring device of FIG. 1, wherein the carrying strap is parted in the middle.

Although not illustrated in the drawing, the measuring lines 1 are electrically connected with the measuring instrument 6 in vicinity of the attachment of the carrying strap 2. The measuring lines 1 are conducted within the carrying strap 2 approximately up to shoulder height in a way which is also not visible in the drawing, and the lines emerge from the carrying strap through restraining elements 19 for protection against breakage. Between the restraining elements 19 which protect against breakage and the measuring probes 3, the measuring lines are in the form of extensible or flexible, spirally coiled cables 4. This feature permits the radius of action or motion of the measuring probes 3 to be varied to almost any length. In order to permit the fullest utilization even of the length of the measuring lines 1 which are embedded in the carrying strap 2, the strap can be parted in the middle. A connecting device 8 is provided for this purpose, but it should only be opened if the work is performed on a table. FIG. 2 shows the measuring device on a table with the carrying strap open.

Figure 3:
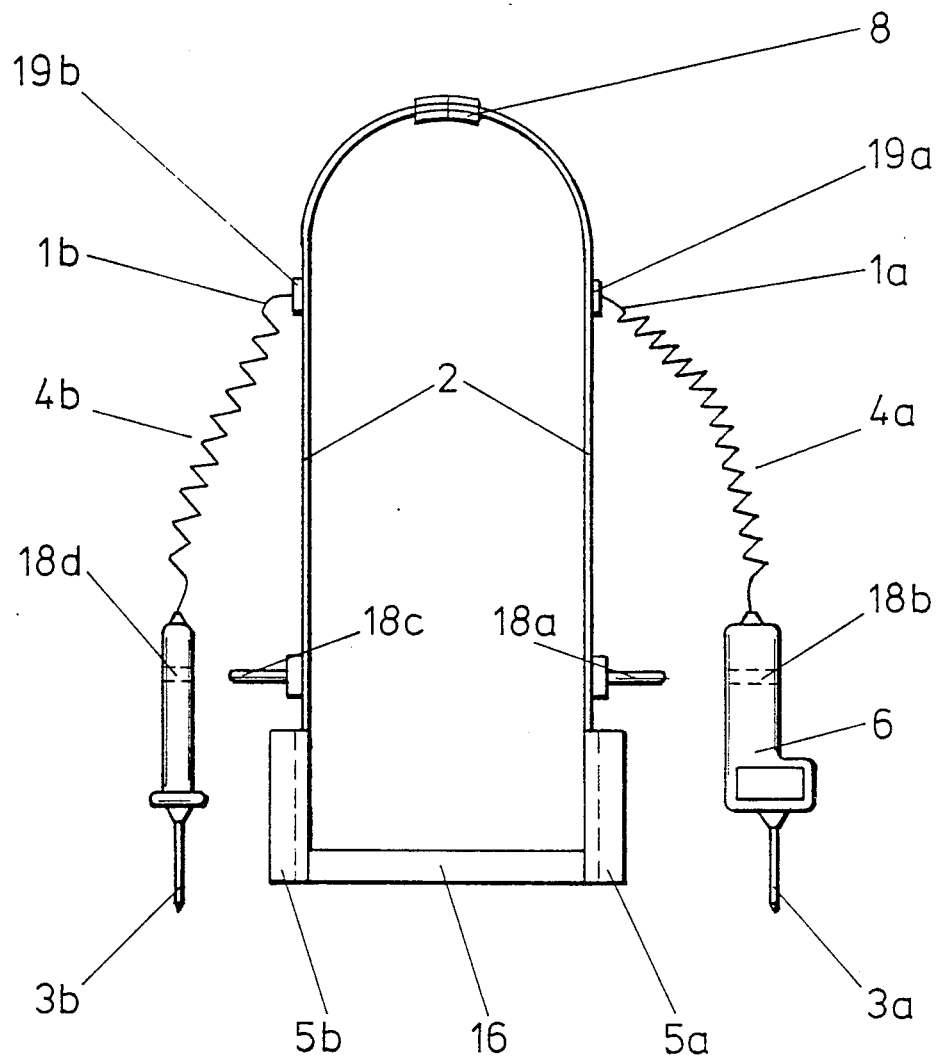
FIG. 3 is a front elevational view of a measuring device, wherein the measuring instrument is combined with a measuring probe.

In FIG. 3, a measuring device is shown wherein the measuring instrument 6 is combined with a measuring probe 3a. The carrying strap 2 is constructed in a manner similar to FIGS. 1 and 2. However, there is a difference in the way that the measuring lines 1 are guided, since they must be continuously connected through the carrying strap. Depending on the circuit structure, the connecting element 8 which serves for parting the carrying strap, must be either omitted or it must be provided with contacts, or the measuring line must be guided through a connection bar 16. The connection bar 16 additionally has the advantage of preventing the carrying strap 2 from slipping off the shoulder. Pins 18a,c are also shown for insertion in holes 18b,d respectively.

Figure 4:
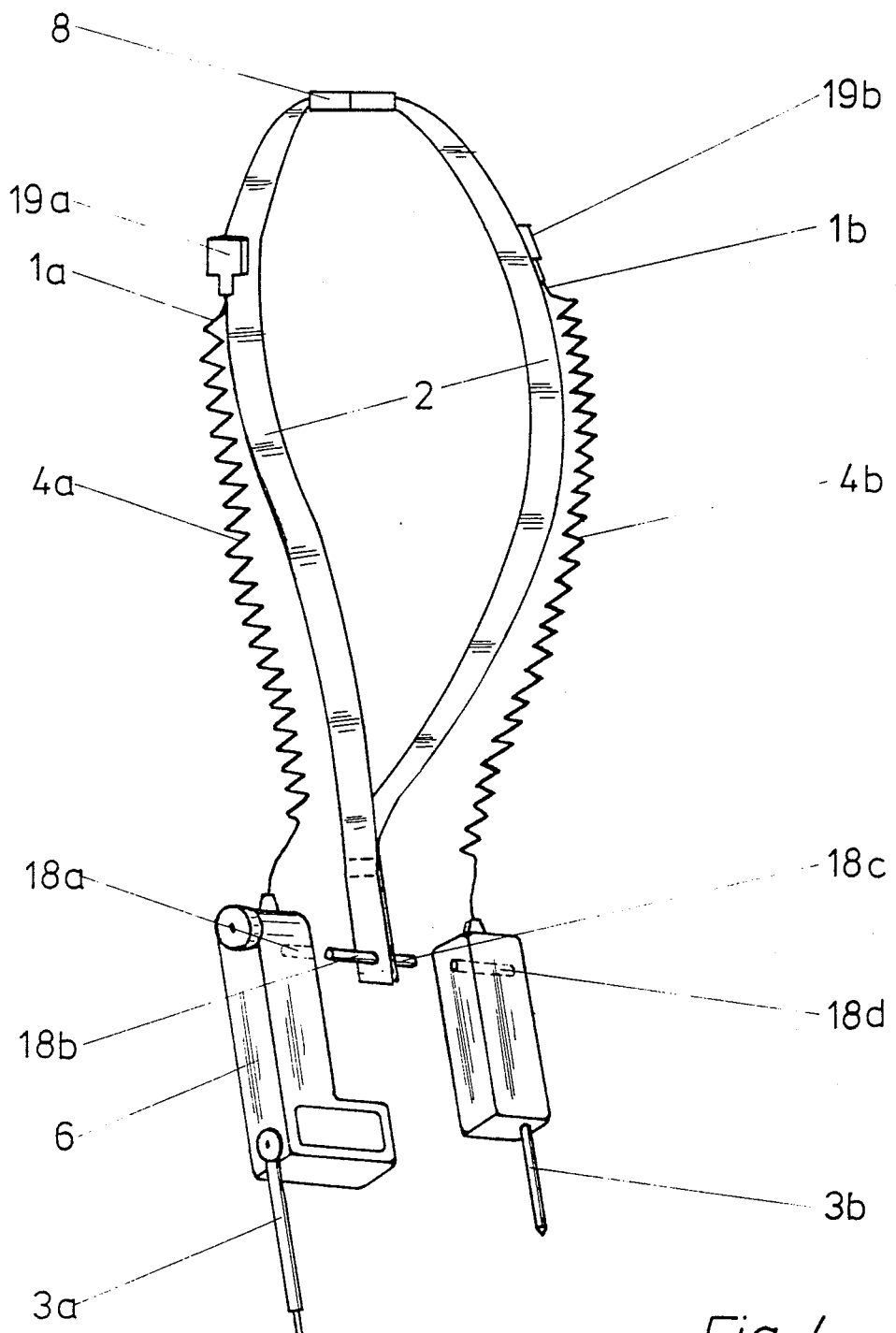
FIG. 4 is a perspective view of a variation of FIG. 3, wherein the measuring probes are connected to the carrying strap by a holding pin.

The portable measuring device shown in FIG. 4 is to a great extent similar to the device shown in FIG. 3, although the storage pocket is omitted. A holding pin 18b which is fastened to the carrying strap 2 is inserted in two openings 18a, d of the measuring probes 3a, b. The measuring probes are formed in such a way that one measuring probe 3b fits into a recess in the other measuring pin 3a of the measuring instrument 3. In this way, an especially reliable and practical fastening device at the carrying strap 2 is achieved.

Figure 5:
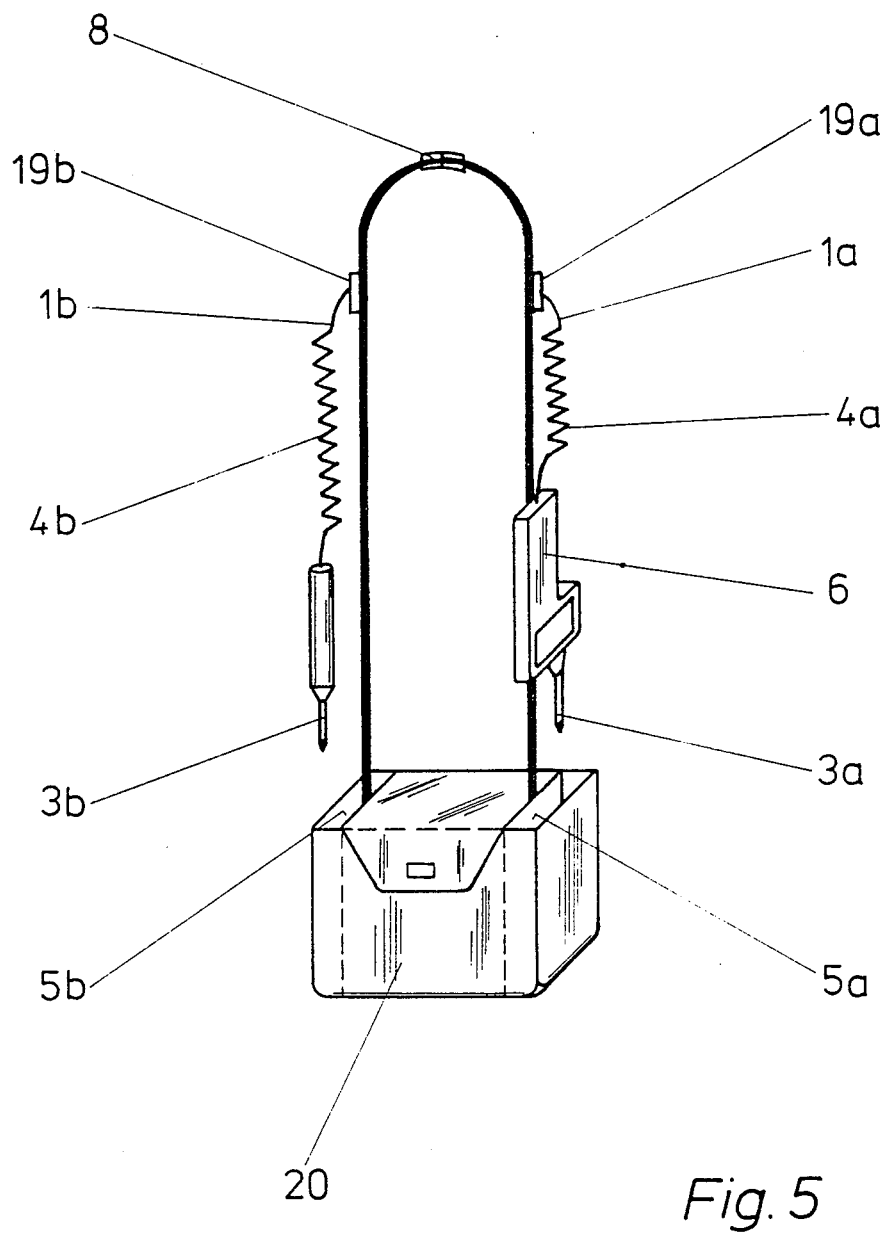
FIG. 5 is a perspective view of another variation of FIG. 3, wherein the measuring probes can be inserted into a convenient storage pocket.

FIG. 5 shows a measuring device, wherein a convenient storage pocket 20 is fastened between the two ends of the carrying strap 2. This handy storage pocket is provided with side compartments for the measuring probes 3 and with a center-compartment for auxiliary measuring equipment.

The foregoing is a description corresponding, in substance, to German application No. P 32 29 689.4, dated Aug. 10, 1982, International priority of which is being claimed for the instant application, and which is hereby made part of this application. Any material discrepancies between the foregoing specification and the specification of the aforementioned corresponding German application are to be resolved in favor of the latter.

There are claimed:

1. Portable measuring device, comprising a measuring instrument, a carrying strap fastened to said measuring instrument for hanging said measuring instrument around the neck, measuring lines electrically connected to said measuring instrument and passing through at least part of said carrying strap, measuring probes connected to said measuring lines, said measuring lines being in the form of flexible spiral cables connected from said carrying strap to said measuring probes, and at least one mounting disposed on said measuring instrument for fastening unused measuring probes hanging on said measuring lines, said carrying strap having two ends fastened to said measuring instrument, said measuring lines being electrically connected to said measuring instrument in vicinity of at least one of said ends of said carrying strap, and said measuring lines emerging from said carrying strap substantially at shoulder height and each hanging down at a respective side of of said measuring instrument and leading to a respective one of said measuring probes.

2. Portable measuring device according to claim 1, wherein said mounting includes at least one holding pin disposed on said carrying strap being engageable in holding openings formed in said measuring probes for securing said measuring probes.

3. Portable measuring device according to claim 1, including restraining elements connecting said flexible spiral cables to said carrying strap where said measuring lines emerge from said carrying strap, for protecting said measuring lines against breakage.

4. Portable measuring device according to claim 1, including means disposed in the middle of said carrying strap for parting and reconnecting said carrying strap.

5. Portable measuring device, comprising a measuring instrument, a carrying strap for hanging said measuring instrument around the neck, measuring lines electrically connected to said measuring instrument, passing through at least part of said carrying strap and emerging from said carrying strap substantially at shoulder height, measuring probes each being connected to a respective one of said measuring lines and each hanging down from a respective side of said carrying strap, one of said measuring probes being combined with said measuring instrument, said measuring lines being in the form of flexible spiral cables between said carrying strap and said measuring probes, and at least one mounting disposed on said carrying strap for fastening unused measuring probes hanging on said measuring lines.

6. Portable measuring device according to claim 5, wherein said carrying strap has ends connected to each other.

7. Portable measuring device according to claim 5, wherein said carrying strap has ends, and including a connecting bar connected between said ends.

8. Portable measuring device according to claim 5, wherein said carrying strap has ends, and said mounting includes a storage pocket fastened between said ends of said carrying strap for receiving said measuring probes.

9. Portable measuring device according to claim 8, wherein said mounting includes at least one holding pin disposed on said carrying strap being engageable in holding openings formed in said measuring probes for securing said measuring probes.

10. Portable measuring device according to claim 5, wherein said mounting includes at least one holding pin disposed on said carrying strap being engageable in holding openings formed in said measuring probes for securing said measuring probes.

11. Portable measuring device according to claim 10, wherein said one measuring probe combined with said measuring instrument has a recess formed therein for receiving the other measuring probe, and said holding pin interconnects said measuring probes substantially at belt height.

12. Portable measuring device according to claim 5, including restraining elements connecting said flexible spiral cables to said carrying strap where said measuring lines emerge from said carrying strap, for protecting said measuring lines against breakage.

13. Portable measuring device according to claim 5, including means disposed in the middle of said carrying strap for parting and reconnecting said carrying strap.

* * * * *